United States Patent [19]

Aschwanden

[11] Patent Number: 4,498,103
[45] Date of Patent: Feb. 5, 1985

[54] SLOW GENLOCK CIRCUIT
[75] Inventor: Felix Aschwanden, Thalwil, Switzerland
[73] Assignee: RCA Corporation, New York, N.Y.
[21] Appl. No.: 417,525
[22] Filed: Sep. 13, 1982
[51] Int. Cl.³ .......................... H04N 5/04; H03L 7/00
[52] U.S. Cl. .................................... 358/148; 358/149; 358/150; 358/158; 358/319; 331/20; 455/208; 455/260; 455/265; 375/120
[58] Field of Search ............... 358/148, 149, 150, 158, 358/319; 331/2 D, 21, 1 A; 307/525, 526, 527; 375/120; 455/183, 208, 260, 265

[56] References Cited
U.S. PATENT DOCUMENTS

| 3,935,388 | 1/1976 | Brinkmann | 358/158 |
| 4,169,659 | 10/1979 | Marlowe | 358/150 |
| 4,231,064 | 10/1980 | Uchida | 358/158 |
| 4,253,116 | 2/1981 | Rogers | 358/149 |
| 4,263,609 | 4/1981 | Aschwanden | 358/14 |
| 4,358,740 | 11/1982 | Dinter | 358/158 |
| 4,408,349 | 10/1983 | Yukawa | 455/183 |
| 4,424,497 | 1/1984 | Fellinger | 375/120 |

OTHER PUBLICATIONS

RCA TG-2A Instruction Manual, Figure 2 and p. 14.

Primary Examiner—Tommy P. Chin
Assistant Examiner—Michael D. Parker
Attorney, Agent, or Firm—E. M. Whitacre; W. H. Meise

[57] ABSTRACT

A genlock circuit has a reference signal that is frequency divided to provide an internal vertical sync signal. When an external sync signal is present, the division ratio is temporarily changed to provide a slow locking of the internal sync signal to the external sync signal. This avoids picture disturbances. The circuit can be used in a camera control unit and camera heads.

4 Claims, 8 Drawing Figures 4,498,103

SLOW GENLOCK CIRCUIT

BACKGROUND OF THE INVENTION

The present invention relates to television synchronization ("sync") circuits, and more particularly to locking such a sync circuit to an external reference signal ("genlock" circuit).

Present genlock circuits use a sync separator which separates sync from an external reference video signal, and derives therefrom a vertical reset pulse which rapidly resets a vertical counter of the sync pulse generator to be locked when the external video signal is first connected to the genlock circuit. This rapid resetting causes a transient phase disturbance in the vertical sync signal of the slaved sync source. Unfortunately, false triggering also is possible in the horizontal sync signal when improper sync separation is caused by a bad connection of the cable conveying the external video or other such temporary interruption of this signal. As a result serious picture disturbances occur. Also power transistors used in deflection circuits and switched mode power supplies could be destroyed by fast sync timing changes. Circuits are known, such as shown in U.S. Patent application Ser. No. 201,435 now U.S. Pat. No. 4,358,740, filed Oct. 28, 1980 in the name of K. Dinter, and assigned to the assignee of the present invention, which use fifty percent duty cycle signals and have horizontal or twice horizontal frequency signals at the output of a phase detector so that the free-running frequency of the slaved generator is the same as the locked frequency. This may require a complex low pass filter for adequate smoothing which filter causes losses and therefore, additional amplification may be needed. Further when genlocking, it is desirable to use the short path phase difference, e.g. $-10°$ C. rather than 350°, between the signals to still further reduce disturbances.

It is therefore desirable to have a genlock circuit that does not cause picture disturbances or damage to transistors when subjected to an intermittent external sync signal or when first connected to an external video signal and does not need complex filters or additional amplifiers.

SUMMARY OF THE INVENTION

Method and apparatus comprising generating a reference signal, frequency dividing said reference signal by an initial division ratio to produce an internal synchronization signal, phase comparing said internal synchronization signal with an external synchronization signal to indicate the short path phase difference between said signals, and changing said division ratio in accordance with the results of said comparison to slow the locking of said internal synchronization signal to said external synchronization signal until phase locking of said internal synchronization signal is achieved, and thereafter changing said division ratio back to said initial division ratio.

DESCRIPTION OF THE DRAWINGS

In the drawings corresponding elements have been given corresponding reference numerals with letter suffixes added if modified.

DETAILED DESCRIPTION

Figure 1:
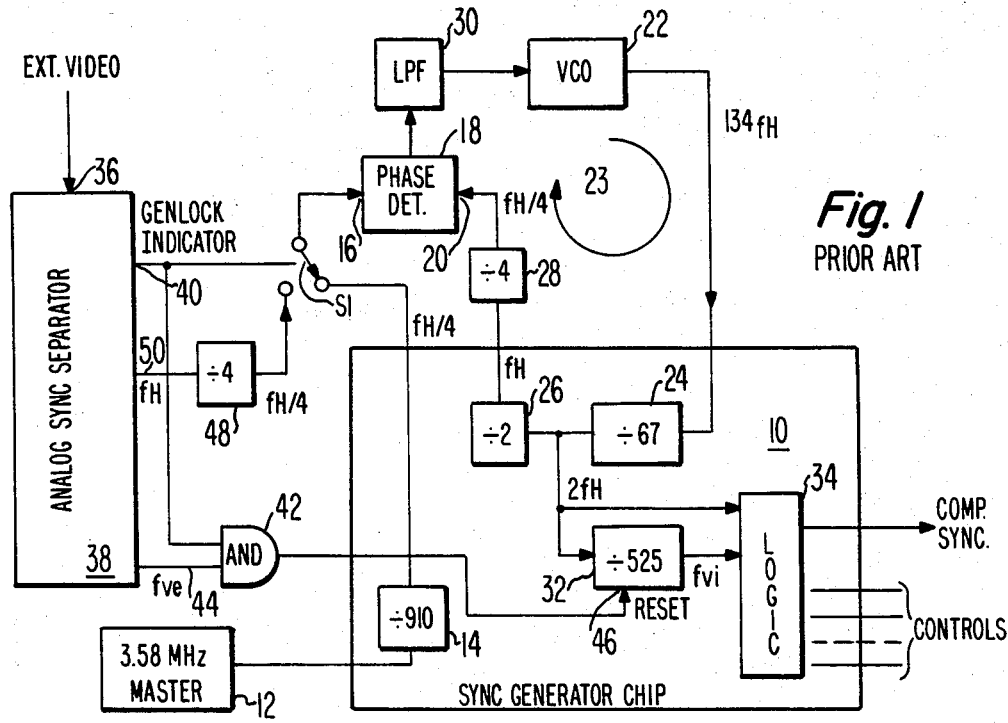
FIG. 1 shows a prior art genlock circuit.

FIG. 1 shows a typical prior art genlock system as used in an NTSC TV camera. A sync pulse generator chip 10, described in U.S. Pat. No. 4,169,659 is used. In the crystal mode operation, switch S1 in FIG. 1 is in the position shown. A 3.58 MHz crystal oscillator 12 (NTSC color subcarrier) provides a master reference signal and is divided in frequency by a factor of 910 by divider 14. The result is an $f_{H/4}$ signal, which is fed to an input 16 of phase detector 18, which detector 18 can be an edge triggered type, such as RCA type CD 4046. Input 20 of phase detector 18 also receives an $f_{H/4}$ signal derived from VCO (voltage controlled oscillator) 22 after frequency dividing by a factor of 67 by a divider 24 and then by a factor of 2 by divider 26 (both dividers 24 and 26 being located in the sync pulse generator 10) and finally frequency dividing by a factor of 4 in an additional divider 28. The frequency of VCO 22 will be changed by an error signal from the output of detector 18 that is smoothed by LPF (low pass filter) 30 as well known until both input signals of phase detector 18 are equal in phase and frequency since components 22, 24, 26, 28, 18, and 30 form a PLL (phase locked loop) 23. A divide-by-525 circuit 32 inside sync pulse generator 10 provides a vertical frequency $f_{vi}$ ("i" meaning "internal"). A composite sync signal is obtained by means of logic circuit 34 as described in said patent.

After an external video signal has been connected to input 36 of analog sync separator 38, the genlock indicator signal from output 40 goes HIGH and is applied to AND gate 42. The next vertical pulse $f_{ve}$ ("e" meaning "external") provided by sync separator output 44 is applied by gate 42 to reset input 46 to reset counter 32 in sync pulse generator chip 10. The genlock indicator signal at output 40 also is applied as a control signal to switch S1 to cause it to switch over to the position opposite to that shown in FIG. 1. Input 16 of phase detector 18 is then connected to the $f_{H/4}$ signal derived from external video by way of a divide-by-four frequency divider 48 that receives a horizontal sync signal $f_H$ from output 50 of separator 38. Horizontal locking to external sync is therefore not obtained by resetting a counter as was done for the vertical locking as described above, but by means of phase locked loop 23.

If the external video signal is disconnected from input 36, both $f_H$ and $f_{ve}$ derived from analog sync separator 38 rapidly disappear, while the genlock indicator signal still may be high for a few milliseconds. This is because the genlock indicator signal is derived from a level detector circuit (not shown) within separator 38, which level detector detects the external video amplitude level, and which then generates the genlock indicator after low pass filtering a DC signal.

As a result, large horizontal disturbances occur because input 16 of the edge triggered phase detector 18 remains connected by switch S1 to receive externally derived signals, but there are no such $f_{H/4}$ pulses present. The phase detector therefore produces a large error signal. The disadvantages of the prior art circuit of FIG. 1 are that when connecting an external video signal vertical disturbances may occur, depending on the phase of $f_{vi}$ relative to $f_{ve}$ after the genlock indicator goes high, and when disconnecting the external video signal horizontal disturbances do occur. Temporary external video signal interruptions cause both horizontal and vertical disturbances.

Figure 2:
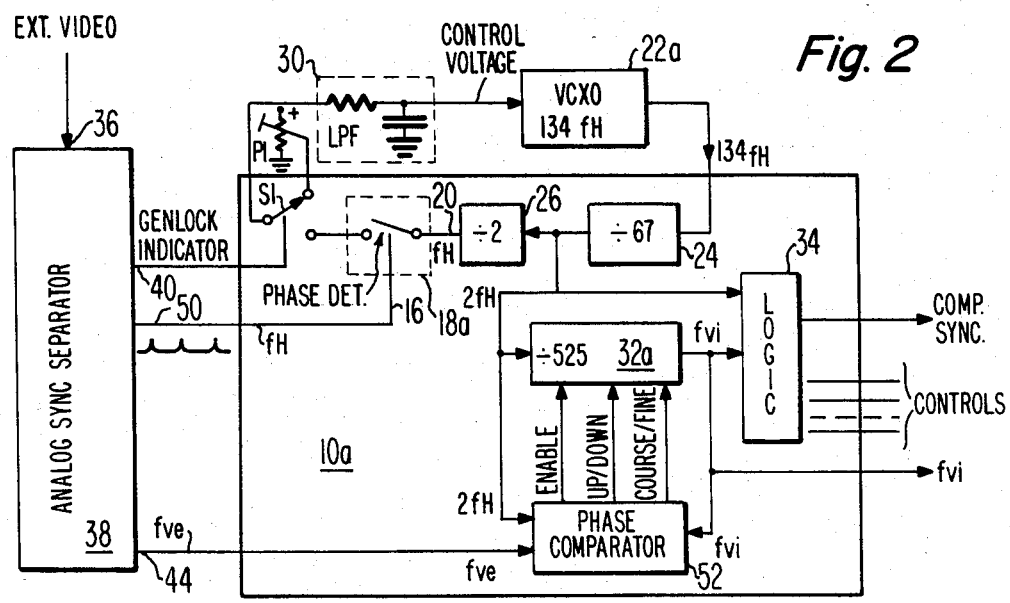
FIG. 2 is a block diagram of a genlock circuit in accordance with the present invention.

A block diagram of an embodiment of the invention is shown in FIG. 2. Analog sync separator 38 is the same as in FIG. 1; however the associated divide-by-four circuit 48 has been eliminated. Switch S1 and phase detector 18a are now located inside a new sync chip 10a in FIG. 2. The subcarrier master oscillator 12 as well as divide-by-910 circuit 14 of FIG. 1 have also been eliminated and the VCO 22 of FIG. 1 is replaced by a voltage controlled crystal oscillator (VCXO) 22a, which serves as the new master reference oscillator for the system and provides a 134 $f_H$ signal.

In the crystal mode of operation, switch S1 of FIG. 2 is in the position shown. A potentiometer P1 can be used to precisely frequency adjust VCXO 22a. Composite sync and other control signals are obtained from logic 34 as described in said patent. LPF 30 does not function to smooth the VCXO input signal in the crystal mode of operation since the input signal is DC.

Figure 3:
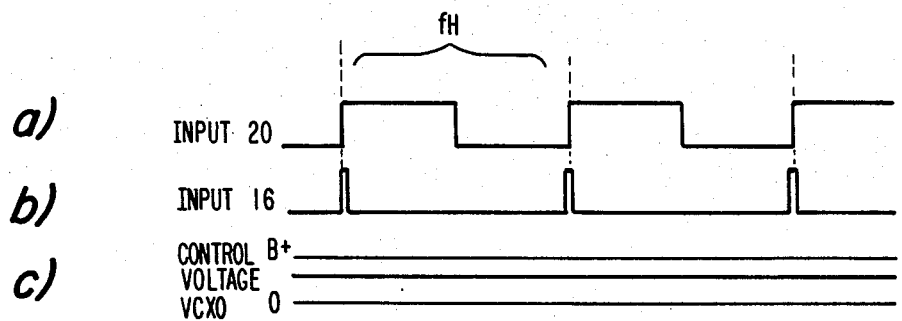
FIGS. 3, 4 and 5 are timing diagrams useful in explaining the operation of FIG. 2.

After an external video signal has been connected, the genlock indicator output 40 becomes HIGH and switches over switch S1 to the position opposite that shown in FIG. 2. Input 16 of phase detector 18a will receive external $f_H$ signals provided from output 50 of analog sync separator 38 and as a result VCXO 22a will be locked to the external horizontal sync as described below. Phase detector 18a comprises a switch and operates as follows: Input 16 receives the $f_H$ signal, which comprises narrow pulses (0.5 μs) derived within separator 38 from external video and shown in FIG. 3b. This signal closes the phase detector (or coincidence detector) switch and connects the wide pulse $f_H$ signal present at input 20 and shown in FIG. 3a to LPF 30 through switch S1, thereby providing the control voltage of FIG. 3c for VCXO 22a until coincidence is achieved. (This type of coincidence phase detector has been described in U.S. Pat. No. 4,263,609). An important characteristic of such a phase detector is that after the signal at input 16 disappears, the control voltage of VCXO 22a does not change. As a result temporary external signal interruptions or disconnecting the external video do not affect VCXO 22a as is the case in the prior art. Also, such detectors have a very high gain, eliminating the need for amplification of its output signal.

The vertical pulse $f_{ve}$ extracted from external video and which is present at output 44 is applied to phase comparator 52 which comparator also receives the $f_{vi}$ signal from divider 32a and a clock signal $2f_H$ from divider 24. Comparator 52 provides output control signals called enable, up/down and coarse/fine. These control signals are supplied to divider 32a. Depending on the phase of $f_{vi}$ relative to $f_{ve}$, these three control signals enable divider 32a to change its division ratio. Such a comparator is shown in U.S. patent application Ser. No. 408,143 filed Aug. 18, 1982 in the names of Glenn A. Reitmeier and Felix Aschwanden, and assigned to the assignee of the present invention.

Figure 4:
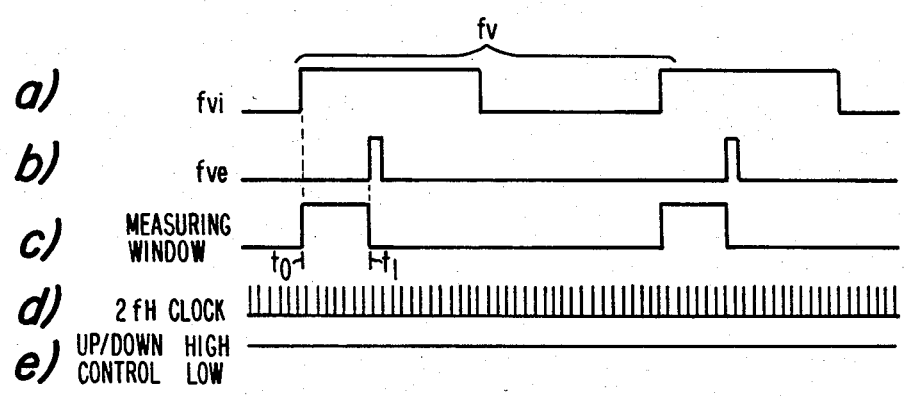
Figure 5:
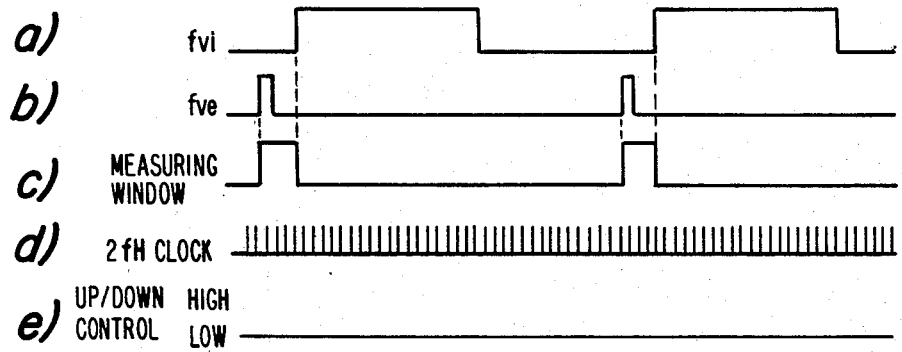

FIG. 4 shows the case when $f_{vi}$ shown in FIG. 4a is leading $f_{ve}$ shown in FIG. 4b. In order to achieve coincidence of $f_{vi}$ with $f_{ve}$, divider 32a must divide by a division ratio greater than 525 until coincidence is achieved. Inside phase comparator 52 a measuring window signal shown in FIG. 4c will be generated representing the phase difference (shown as the interval $t_0$–$t_1$) between $f_{vi}$ and $f_{ve}$. This window enables a counter within comparator 52 to count $2f_H$ clock pulses from divider 67 during the interval $t_0$–$t_1$. If the content of the counter within comparator 52 after $t_1$ is greater than or equal to 7, the coarse/fine signal becomes HIGH, if the content is less than 7, this signal becomes LOW. The up/down control signal can be obtained by sampling the logic level of $f_{vi}$ by means of pulse $f_{ve}$ within comparator 52. The polarity of the up/down signal is HIGH in FIG. 4e during the occurrence of the pulse $f_{ve}$ and is LOW in FIG. 5e showing the case where $f_{vi}$ is lagging $f_{ve}$. Note that the measuring window starts with the leading edge of $f_{ve}$ and ends with the leading edge of $f_{vi}$ in FIG. 5c and vice versa in FIG. 4c. Because $f_{vi}$ is lagging $f_{ve}$ in FIG. 5, divider 32a in FIG. 2 must divide by a division ratio less than 525. The up/down signal therefore determines whether the divider 32a has to increase or decrease its division ratio from 525 and does indicate the direction of counting. When the division ratio is changed, a non-standard signal results. This can cause difficulties with television equipment such as recorders and special effects devices. To reduce the amount of time that a non-standard signal is present, a short path signed phase difference signal is used (−10° rather than +350°). The up/down signal is the sign of the signal and thus permits this mode of operation. To generate the enable control signal, the measuring window signal of FIGS. 4c and 5c could be used. It becomes obvious that this signal is LOW all the time if $f_{vi}$ coincides with $f_{ve}$ and HIGH otherwise.

The coarse/fine control signal, the enable signal, and the up/down control signal, are decoded within counter 32a to determine the division ratio of divider 32a (comprising a 10-bit programmable counter) as shown in the following table.

TABLE 1

| SIGNAL OR RATIO | STATE | | | | |
| --- | --- | --- | --- | --- | --- |
| enable | H | H | H | H | L |
| up/down | L | L | H | H | X |
| coarse/fine | L | H | L | H | X |
| division ratio | 524 | 517 | 526 | 533 | 525 |

In the above table "H", "L", and "X" mean HIGH, LOW and do not care, respectively. It is noted from Table 1 that the coarse/fine signal determines whether the locking takes place in steps of 8 (coarse) or 1 (fine) $2f_H$ pulses. It is further noted that the coarse locking step (8 half lines) need not precisely correspond to the coarse measurement of phase error (7 or more half lines), since phase locking is assured by the fine locking step.

The lock-up speed can be calculated as follows: Half a field difference between $f_{vi}$ and $f_{ve}$ is the worst case error which corresponds to 525/2, which approximately equals 262 clock periods of the $2f_h$ clock from divider 24. This error will be corrected by means of changing the division ratio as shown in Table 1.

By finding multiples of 8 and 1 whose sums equal 262, which represents the maximum value (180 degrees equals 525/2) of the phase difference, it can be determined that a total number of 38 correction cycles are required (32×8+6×1=262, 32+6=38) to accomplish the worst case correction. A correction can be made once per field and takes:

$$\frac{1}{60 \text{ Hz}} = 16.6 \text{ ms}.$$

and therefore 38 cycles take 0.63 s(worstcase). (The value of the coarse correction of 8 $2f_H$ could be changed to vary lock-up speed). The method just described can also be used for horizontal correction (comparator 56 of FIG. 6, described below) by having a counter that has a division ratio variable about 134 and is applicable for all TV standards such as by using a division ratio variable about 625 for the vertical counter for a European PAL standard.

More sophisticated cameras are divided into two units, the camera head and the base station, which units are connected by means of multiconductor cables, triax cables, etc. The distance between head and base station may vary between 50 feet and several miles, and therefore a considerable signal delay occurs depending on the cable length. Autotiming loops are used to compensate for this delay be advancing the head sync system relative to the base station. Here again soft locking is desirable. This is possible by using the same circuits described above. By means of pin-multiplexing, chip 10a shown in FIG. 2 can be used for the autotiming loop as will be explained below.

Figure 6:
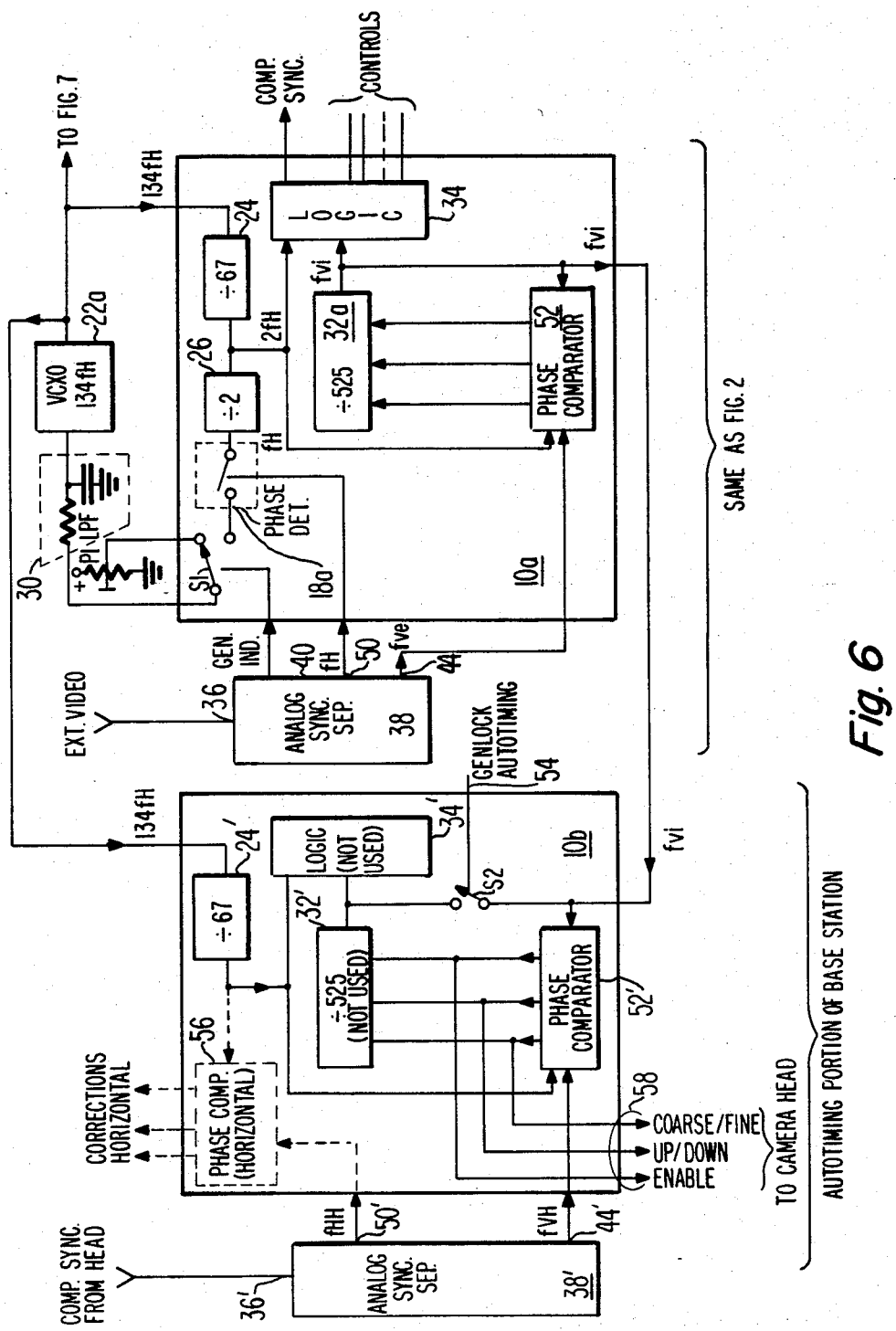
FIG. 6 shows how an integrated circuit ("chip") of FIG. 2 can be used in an autotiming loop at a base station camera control unit.
Figure 7:
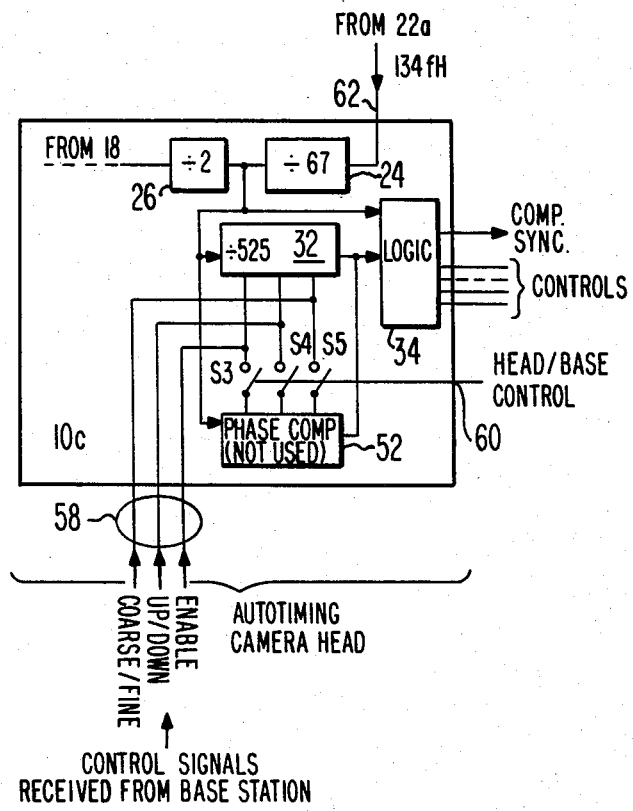
FIG. 7 shows how said chip is used at the camera head.

FIG. 6 shows the base station. The right side of FIG. 6 corresponds to FIG. 2 and provides the $f_{vi}$ signal which is fed to the circuit on the left side. The left side circuit has chip 10b, which is the same as chip 10a of FIG. 2 except that the three outputs of phase comparator 52′ also are available outside chip 10b and a switch S2, as well as a switch control input 54, labeled "Genlock/Autotiming" is added. If switch S2 is in the position shown in FIG. 6, the output of counter 32′ is disconnected from phase comparator 52′. It should be noted that the left side of FIG. 6 receives the same 134 $f_H$ reference signal as does chip 10a from VCXO 22a. Analog sync separator 38′ receives at input 36′ composite sync from the camera head (not shown) and separates horizontal $f_{HH}$ ("H" meaning "head") and vertical $f_{VH}$ sync signals from the composite sync signal and then provides them at outputs 50′ and 44′ respectively for comparison with the corresponding references in the base station. In order to simplify FIG. 6, only the comparison of the vertical signals $f_{VH}$ with $f_{vi}$ is shown. A similar phase comparison operation is carried out for horizontal sync by comparing $f_{HH}$ with $f_{Hi}$ by phase comparator 56 (shown in dotted lines). Comparator 56 has an internal divide-by-two divider (not shown) that corresponds to divider 26 of FIG. 2 in order to divide the $2f_H$ signal from divider 24′. Phase comparator 52′ compares $f_{vi}$ and $f_{VH}$ and provides three signals enable, up/down and coarse/fine respectively depending on the phase error between $f_{vi}$ and $f_{VH}$ as described above. These three signals are transmitted to the camera head by way of cable 58 in order to correct the phase error at the camera head. FIG. 7 shows a chip 10c in the camera head which is similar to chips 10a and 10b. Again some switches have been added and a control signal, labeled "Head/Base" control, which is received at input 60, controls added switches S3, S4, S5. If S3, S4 and S5 are in the open position as shown in FIG. 7, then the division ratio of counter 32 can be controlled by means of said three control signals provided from base station 10b on cable 58. It should be mentioned again, that the horizontal phase in head 10c also must be controlled. This can be done in exactly the same manner as control of the vertical phase by adding a second phase comparator (not shown) as is done in head chip 10b by comparator 56.

Figure 8:
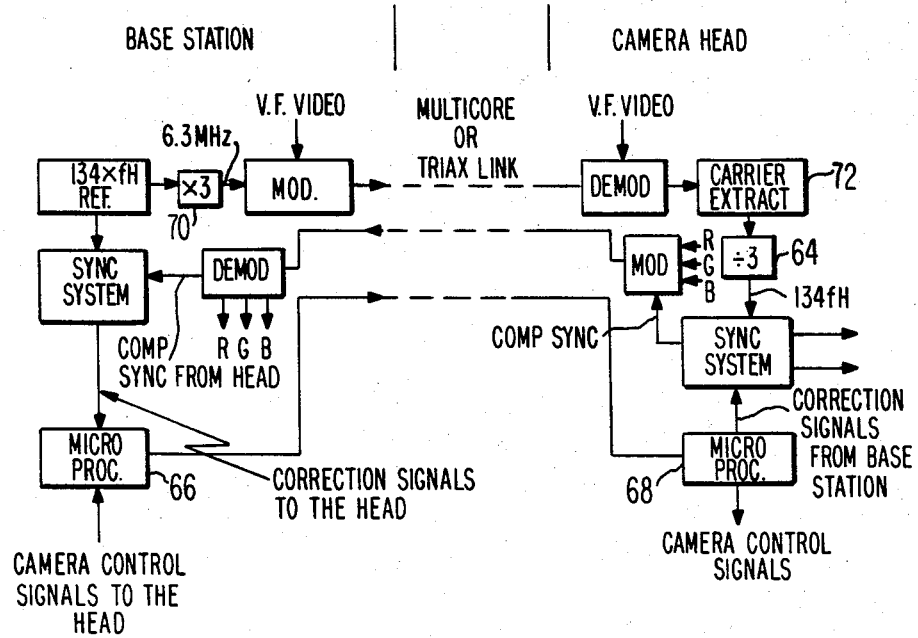
FIG. 8 shows how the circuits of FIGS. 6 and 7 are interconnected.

Chip 10c of FIG. 7 also receives a 134 $f_H$ reference clock at input 62. This reference must be phase and frequency locked to the 134 $f_H$ reference in the base station. How the head reference will be locked to the base station reference as well as how the correction signals are fed from the base to the head is not the subject of this invention. However, a solution is shown in FIG. 8.

Many video and control signals have to be transmitted from the base station to the head and vice versa. For instance a VF (view finder) video signal is fed from the base station to the head. It has been found to be desirable to transmit video signals by means of a carrier frequency rather than to transmit such signals in baseband. This is because the equalization of the cable frequency response becomes much easier. In FIG. 8 a carrier frequency of 3 times 134 $f_H$ (=6.3 MHz) is generated by multiplier 70. In the camera head, this carrier can be extracted by circuit 72 and after division by a factor of three by divider 64 the 134 $f_H$ reference is obtained, which is locked to the base station reference as required.

In sophisticated cameras, approximately 200 different control signals must be transmitted from the base station to the camer head. This only becomes simple if microprocessors 66 and 68 are involved to control the "data traffic". It is very easy to connect the sync system correction signals to such a microprocessor control system as shown in FIG. 8 in block diagram form.

The system just described is very economical. A single chip can be used in three different ways. Namely: to genlock equipment to external video signals; in auto timing loops to provide correction signals containing horizontal and vertical errors to be transmitted to the camera head, and in auto timing loops to receive these "errors" in order to lock up the loop.

What is claimed is:

1. A method comprising:
   generating a reference signal;
   frequency dividing said reference signal by an initial division ratio to produce an internal synchronization signal;
   phase comparing said internal synchronization signal with an external synchronization signal to indicate the phase difference between said internal synchronization and external synchronization signals in a short-path direction;
   changing said frequency dividing of said reference signal to a second division ratio in accordance with the results of said phase-comparing step in order to accomplish locking of said internal synchronization signal to said external synchronization signal when said phase difference between said interval and external synchronization signals is large;
   changing said frequency dividing of said reference signal to a third division ratio intermediate said initial and second division ratios in accordance with said results of said comparison to slow said locking of said internal synchronization signal to said external synchronization signal when said phase difference between said internal and external synchronization signals is small; and changing said division ratio back to said initial division ratio when phase locking of said internal synchronization signal to said external synchronization signal is achieved.

2. Apparatus comprising:
input means for receiving an external synchronization signal;
reference signal generating means for generating a reference signal;
dividing means coupled to said reference signal generating means for frequency dividing said reference signal by a selectable division ratio to produce an internal synchronization signal;
comparing means coupled to said input means and to said dividing means for phase comparing said internal synchronization signal with said external synchronization signal to indicate the presence of phase-lock between said internal synchronization signal and said external synchronization signal, and in the absence of said phase-lock to indicate the magnitude of the phase difference between said internal synchronization signal and said external synchronization signal by a short path, said comparing means including means for setting said selectable division ratio to an initial division ratio during intervals when said presence of phase-lock is indicated, and for changing said selectable division ratio in said dividing means to a second division ratio during intervals when said magnitude exceeds a pedetermined amount for providing fast progress towards locking of said internal synchronization signal to said external synchronization signal, and for changing said selectable division ratio to a third division ratio intermediate said intial and second division ratios during intervals when said magnitude is less than said predetermined amount to slow the locking of said internal synchronization signal to said external synchronization signal until phase locking of said internal synchronization signal to said external synchronization signal is achieved and thereafter changing said division ratio back to said initial division ratio.

3. Apparatus as claimed in claim 2, wherein each of said synchronization signals comprise a television vertical synchronization signal.

4. Apparatus as claimed in claim 3, further comprising a synchronization separator having an input terminal for receiving a composite video signal, and a first output means coupled to said input means for providing said external synchronization signal, second output means for providing an external horizontal synchronization signal, and third output means for providing a genlock signal;
and a phase locked loop including said reference signal generating means; at least one frequency divider having an input coupled to said reference signal generating means and an output coupled to said dividing means; a phase detector having a first input coupled to said synchronization separator second output means, and second input coupled to said frequency divider, and an output; a switch having a pair of inputs coupled to said phase detector output and a source of control potential respectively, a control input coupled to said synchronization separator third output means, and an output; and a low pass filter coupled between said generating means and said switch output.

* * * * *